(12) United States Patent
Chang

(10) Patent No.: US 6,399,998 B1
(45) Date of Patent: Jun. 4, 2002

(54) HIGH VOLTAGE INSULATED-GATE BIPOLAR SWITCH

(75) Inventor: Hsueh-Rong Chang, Thousand Oaks, CA (US)

(73) Assignee: Rockwell Technologies, LLC, Thousand Oaks, CA (US)

( * ) Notice: Subject to any disclaimer, the term of this patent is extended or adjusted under 35 U.S.C. 154(b) by 0 days.

(21) Appl. No.: 09/675,401

(22) Filed: Sep. 29, 2000

(51) Int. Cl.$^7$ ............... H01L 27/082; H01L 27/102; H01L 29/70; H01L 31/11
(52) U.S. Cl. ............ 257/565; 257/139; 257/586
(58) Field of Search ............... 257/330, 329, 257/22, 23, 38, 565, 586, 366, 132, 139

(56) References Cited

U.S. PATENT DOCUMENTS

| | | | | |
|---|---|---|---|---|
| 4,587,712 A | * | 5/1986 | Baliga | 257/22 |
| 4,620,211 A | * | 10/1986 | Baliga et al. | 257/38 |
| 4,901,127 A | * | 2/1990 | Chow et al. | 257/38 |
| 4,942,445 A | * | 7/1990 | Baliga et al. | 257/38 |
| 4,994,871 A | * | 2/1991 | Chang et al. | 257/23 |
| 5,329,142 A | | 7/1994 | Kitagawa et al. | 257/139 |
| 5,471,075 A | * | 11/1995 | Shekar et al. | 257/139 |
| 5,488,236 A | * | 1/1996 | Baliga et al. | 257/132 |
| 5,648,283 A | * | 7/1997 | Tsang et al. | 257/329 |
| 6,262,470 B1 | * | 7/2001 | Lee et al. | 257/565 |

OTHER PUBLICATIONS

H. R. Chang, Member, and B. Jayant Baliga, Fellow, IEEE, *500–V n–Channel Insulated–Gate Bipolar Transistor With A Trench Gate Structure*, 1989, pp. 1824–1828.

* cited by examiner

*Primary Examiner*—David Nelms
*Assistant Examiner*—Andy Huynh
(74) *Attorney, Agent, or Firm*—Koppel, Jacobs, Patrick & Heybl

(57) ABSTRACT

An insulated-gate bipolar switch contains a number of trench-IGBT structures interdigitated with a number of floating mesas and trench gates to reduce inversion channel density. The IGBT mesa widths and the floating mesa widths are made different, which enables the switch to provide desired $V_{FD}$, SCSOA and RBSOA values. The mesa widths and the number of floating mesas per unit cell are adjusted as needed to provide a switch having desired characteristics.

29 Claims, 6 Drawing Sheets

HIGH VOLTAGE INSULATED-GATE BIPOLAR SWITCH

BACKGROUND OF THE INVENTION

1. Field of the Invention

This invention relates to the field of semiconductor switching devices, and particularly to switching devices used in high-power switching circuits.

2. Description of the Related Art

Semiconductor devices are increasingly required to accommodate high currents and/or high voltages without failing. Many applications, such as pulse-width modulated motor-control circuits, require high-power switching devices. A number of devices have been developed to provide the high current and reverse blocking characteristics needed in a high power switch. The available devices offer various levels of performance for the primary parameters of interest, such as forward voltage drop VFD and safe-operating-area (SOA). SOA is defined as the current-voltage boundary within which a power switching device can be operated without destructive failure, and is typically specified for both short-circuit (SCSOA) and reverse-biased (RBSOA) operating conditions.

One such high power switch is an insulated-gate bipolar transistor (IGBT) which employs a trench-gate structure; such a device is described in detail in H.-R. Chang and B. Baliga, "500-V n-Channel Insulated-Gate Bipolar Transistor with a Trench Gate Structure", IEEE Transactions on Electron Devices, Vol. 36, No. 9, September 1989, pp. 1824–1828. The use of a trench gate structure enables the IGBT to have a very high "inversion channel density", which is defined as the number of inversion channels per unit area. This results in the device having a very high saturation current level. Unfortunately, when such a device is short-circuited, the high saturation current level can result in the device's destruction; as such, the device's SCSOA tends to be poor. One possible solution to this problem is the use of external short-circuit protection circuitry; however, such circuitry adds undesirable cost and complexity to the device.

Another power semiconductor switch is described in U.S. Pat. No. 5,329,142 to Kitagawa et al. This device employs a number of IGBT structures, with each IGBT separated from its adjacent IGBT with several trench gates and "floating mesas" (i.e., areas between adjacent gates capped with an oxide layer). The IGBT mesas and the floating mesas are equal in width, and all are narrow. The use of floating mesas and a deep trench tends to improve the device's $V_{FD}$; however, the narrow mesas results in a high channel density, and thus a very high saturation current level and a poor SCSOA.

Furthermore, the deep trenches cause the switch's reverse breakdown voltage characteristic to be poor. When the device is reversed-biased, the deep trenches cause the reverse-bias-induced electric field to be non-uniform with very high peaks at the corners of the trench bottoms, which can lead to the premature breakdown of the device.

The described device also employs P base regions which terminate well above the bottoms of the trench gates. This also contributes to the formation of a non-uniform reverse-bias-induced electric field with high peaks, and a poor breakdown characteristic.

SUMMARY OF THE INVENTION

An insulated-gate bipolar switch is presented which overcomes the problems noted above. The new switch is particularly well-suited to high-power switching applications, providing simple gate voltage control of switching, low $V_{FD}$, and robust SCSOA and RBSOA, using a simplified device fabrication process.

The novel structure contains a number of trench-IGBT structures, but reduces the inversion channel density of a conventional trench-IGBT device by interdigitating a number of floating mesas and trench gates between IGBT structures. The reduced inversion channel density lowers the saturation current level (when compared with an all-IGBT implementation) and thus improves SCSOA. The IGBT mesa widths and the floating mesa widths are made non-equal, which enables the switch to provide desired $V_{FD}$, SCSOA and RBSOA characteristics.

In a preferred embodiment, the IGBT mesas are wide and the floating mesas are narrow. The accumulation channels which form along the bottoms of the trench gates enhance electron injection efficiency and thereby keep the switch's forward voltage drop $V_{FD}$ low. The narrow floating mesas improve the uniformity and lower the peaks of a reverse-bias-induced electric field, thereby improving RBSOA, which is further improved by making the depths of the trench gates equal to that of the P base regions in the IGBT mesas. The mesa widths and the number of floating mesas per unit cell are adjusted as needed to provide a device having a desired set of characteristics.

Further features and advantages of the invention will be apparent to those skilled in the art from the following detailed description, taken together with the accompanying drawings.

BRIEF DESCRIPTION OF THE DRAWINGS

FIG. 2 is a sectional view of the switch of FIG. 1, illustrating the mechanism by which it is turned on.

DETAILED DESCRIPTION OF THE INVENTION

Figure 1:
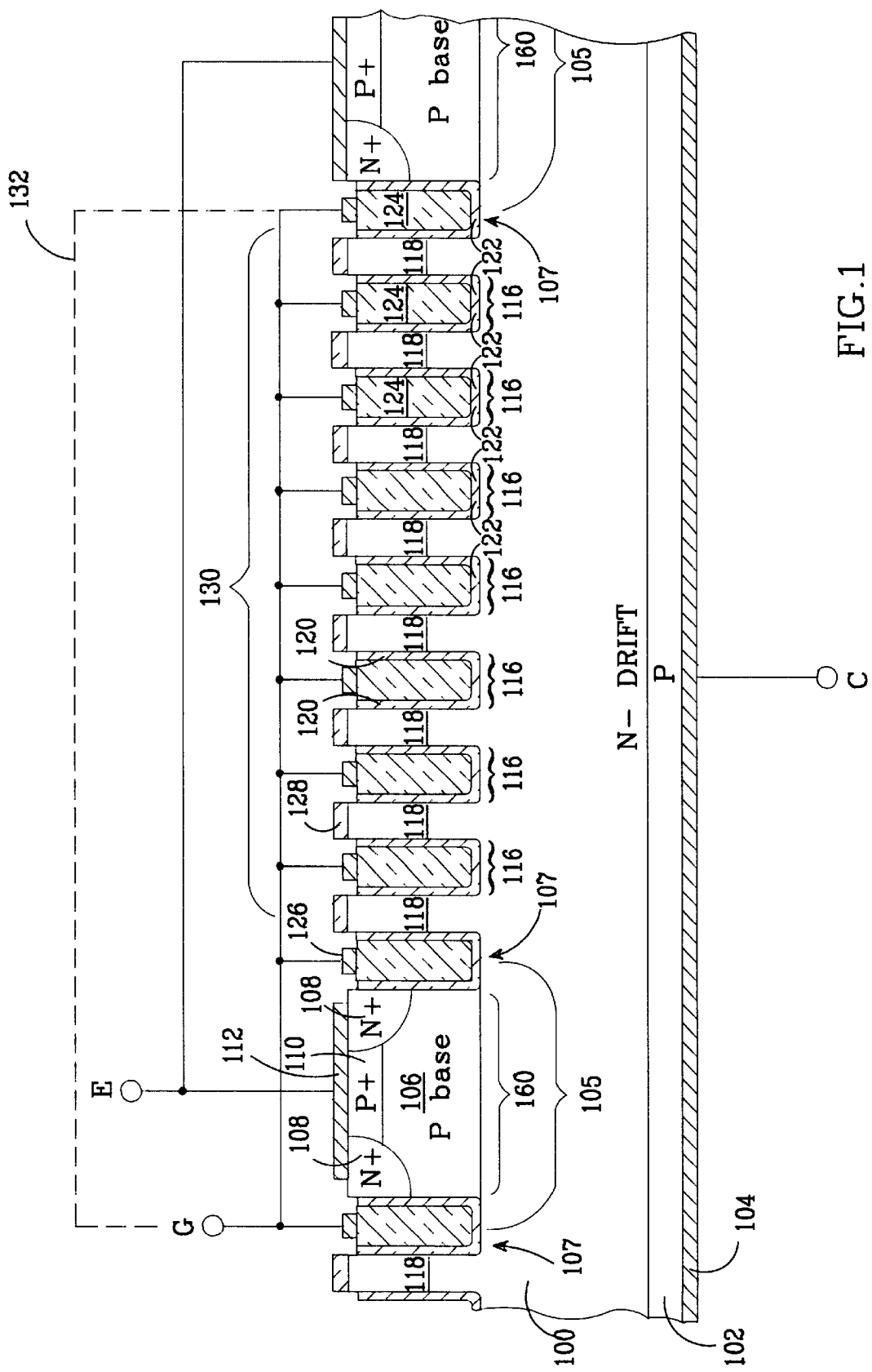
FIG. 1 is a sectional view of an insulated-gate bipolar switch per the present invention.

An exemplary embodiment of an insulated-gate bipolar switch in accordance with the present invention is shown in FIG. 1. A foundation for the device is formed from an N- drift layer 100 on a P layer 102. An electrode 104 contacts the P layer 102 and serves as the device's collector terminal C.

Three types of structures are built on this foundation: trench-IGBTs, trench gates, and floating mesas. A trench-IGBT structure 105 is formed with a P base region 106 sandwiched between a pair of trench gates 107 on N- drift layer 100, and N+ regions 108 occupying at least one of the upper corners of the P base region. A shallow P+ region 110 on P base region 106 provides an ohmic contact to the P base. An electrode 112 contacts both the P+ ohmic contact and N+ regions of each IGBT and serves as the device's emitter terminal E. As used herein, a "+" (i.e., P+ or N+)

denotes a carrier concentration of at least $1 \times 10^{18}/cm^3$, and a "−" denotes a carrier concentration of less than $5 \times 10^{16}/cm^3$.

A plurality of additional trench gates 116 are recessed into N− drift layer 100 between trench-IGBTs 105, with adjacent gates separated by respective floating mesas 118. Each trench gate 107 and 116 includes an oxide layer formed into a trench which includes oxide sidewalls 120 and an oxide bottom 122. The corners of the trench gate bottoms are preferably rounded, which reduces their susceptibility to breakdown when subjected to a reverse-bias-induced electric field. Each trench is filled with a conductive material 124, and an electrode 126 contacts the conductive material in each trench and provides a gate terminal G. Conductive material 124 conducts a voltage applied to gate terminal G to oxide sidewalls 120 and bottom 122, as well as providing a planar device surface. Because it easily fills the trench and provides a planar device surface, the conductive material 124 is preferably polysilicon that has been heavily doped with donors; however, other materials that can fill the trenches and provide good conductivity could also be used.

Each floating mesa 118 consists of material sandwiched between respective pairs of trench gates 116, which can include the N− drift, P base and/or P+ materials used in other portions of the structure, for example. An oxide layer 128 across the top surface of each floating mesa electrically isolates the floating mesas from the rest of the switch. Thus, a pattern of structures 130 comprising trench gates 116 alternating with floating mesas 118 is located between each pair of trench-IGBT structures 105. A trench-IGBT structure 105 and the pattern of structures 130 located between it and the next IGBT structure form a "unit cell" 132. A practical high power device will include a number of unit cells which are replicated across a die to achieve a desired current rating.

Figure 2:
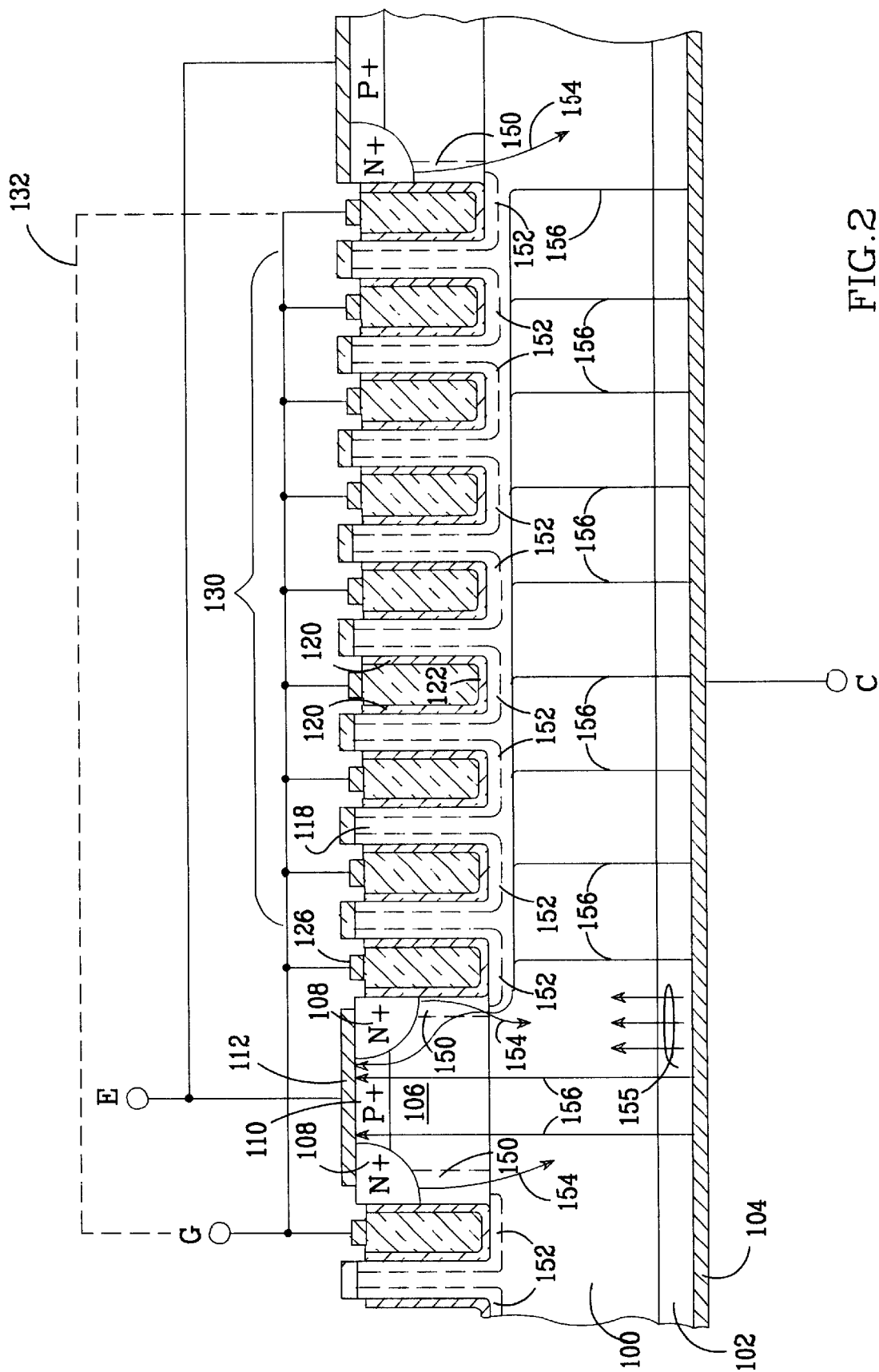

The mechanism by which the switch is turned on is illustrated in FIG. 2. A voltage which is positive with respect to emitter 112 is applied to gate terminal G. The presence of gate sidewalls 120 adjacent to the P base regions 106 of trench-IGBT structures 105 causes N− type inversion channels 150 to form across the P base regions between N+ regions 108 and N− drift layer 100. The positive gate voltage also causes accumulation channels 152 to form adjacent to the gate sidewalls 120 and bottoms 122 that contact N− drift layer 100. Inversion channels 150 allow electrons to flow from N+ regions 108 to N− drift layer 100 (as indicated by arrows 154), providing base drive for trench-IGBT structures 105. In response, holes are injected (arrows 155) from the collector into N− drift layer 100. Accumulation channels 152 have a high channel mobility, which serves to enhance electron injection efficiency and reduce channel resistance. As indicated by arrows 156, current flows through the device near accumulation channels 152 and trench-IGBT structures 105 as the injected holes cross the N− drift layer and are collected at the emitter.

The enhanced electron injection efficiency provided by the accumulation channels tends to lower $V_{FD}$. This enables the device to be made with a shallower trench depth than is described in the prior art, making the device easier to fabricate.

Referring back to FIG. 1, the portions of IGBT structures 105 which are sandwiched between trench gates 107 are referred to herein as "conductive mesas" 160. The width of a conductive mesa is defined by the distance between the gates 107 bounding the sides of IGBT structure 105.

The invention requires that the widths of floating mesas 124 be different from the widths of conductive mesas 160. This is done to enable the resulting switch to provide a desired combination of $V_{FD}$, SCSOA, and RBSOA characteristics. As noted above, the accumulation channels 152 formed across the bottoms of trench gates 107 and 116 lower channel resistance and enhance the device's electron injection efficiency, thereby keeping $V_{FD}$ low. The use of multiple floating mesas 124 between conductive mesas 160 lowers the switch's inversion channel density, particularly when the conductive mesas are made wide; this serves to reduce the saturation current level and improve SCSOA. If internal short-circuit protection is not needed, the conductive mesas can be made narrow, which increases the saturation current level and further lowers $V_{FD}$.

When a robust RBSOA is desired, floating mesas 118 are made narrow. The oxide side-walls of gates 107 and 116 act as field plates, which cause the peak of the electric field induced by a reverse voltage across the device to be more evenly distributed across the floating mesa, effectively lowering the peak field in the mesa region. The protection afforded by the field plates is greatest when the floating mesas are narrow.

RBSOA is further improved by making the bottoms of the trench gates extend to the bottom of P base regions 106. The bottom corners of the trench gates are particularly susceptible to premature breakdown from the high peak electric fields encountered when the device is reverse-biased. When the depth of the trench gates is made about equal to that of P base regions 106 (preferably within about 0.2 $\mu$m), the electric field induced by a reverse voltage is made more uniform and has lower peaks than it would with gates that extend below the P base region. This effectively increases the device's RBSOA, and improves its reverse breakdown voltage characteristic. Note that if a P base region extends below the bottom of its adjacent trench gates, it must remain confined to its conductive mesa area; if the P base region extends outside its conductive mesa such that it prevents the formation of accumulation channels below the adjacent trench gates, switch performance will be adversely affected.

A preferred switch is arranged to provide low $V_{FD}$, robust SCSOA and RBSOA, and a good reverse breakdown voltage characteristic. This is accomplished by making both the conductive mesas 160 and the pattern of structures 130 wide, making floating mesas 118 narrow, and extending trench gates 107 and 116 to the bottom of P base regions 106. Low $V_{FD}$ is provided by the wide conductive mesas and the accumulation channels formed across the bottoms of the trench gates. SCSOA is improved because the wide conductive mesas and wide pattern of structures lower inversion channel density, and the narrow floating mesas and extended gate depth improve RBSOA and the reverse breakdown voltage characteristic.

One switch which provides a good combination of characteristics as noted above is fabricated with trench-IGBT structures 105 having conductive mesas 160 with a uniform width of about 24 $\mu$m each, and structure patterns 130 that include 7–9 trench gates 116 having a uniform width of about 3 $\mu$m each, alternating with 8–10 floating mesas having a uniform width of about 2 $\mu$m each. The depth of trench gates 107 and 116 is made about equal to the depth of P base regions 106. These dimensions result in unit cells that are about 67 $\mu$m wide, which provides a low inversion channel density and a robust SCSOA. The narrow floating mesas and equal P base/trench depths act to improve RBSOA and the reverse breakdown voltage characteristic as described above.

The depth of P base regions 106 is dependent on the desired voltage rating of the switch, with a deeper P base region providing a higher voltage rating. For example, a P base depth of 2.5–3 µm provides a voltage rating of about 1200 volts. Once the depth of P base regions 106 is determined, trench gates 107 and 116 are preferably made to have an depth equal to that of the P base regions, to provide the advantages noted previously. Note that if the P base regions are made shallower than the trench depth, the trench corners are more exposed and the reliability of the device can be adversely affected. On the other hand, if the P base regions are made deeper than the trench depth, some of the accumulation channels are shortened such that $V_{FD}$ is increased.

Note that the structure dimensions given above are merely exemplary. The widths of the mesas and trench gates, the depths of the gates, and the configuration of pattern 130 are all chosen to provide a desired set of switch characteristics.

Figure 3:
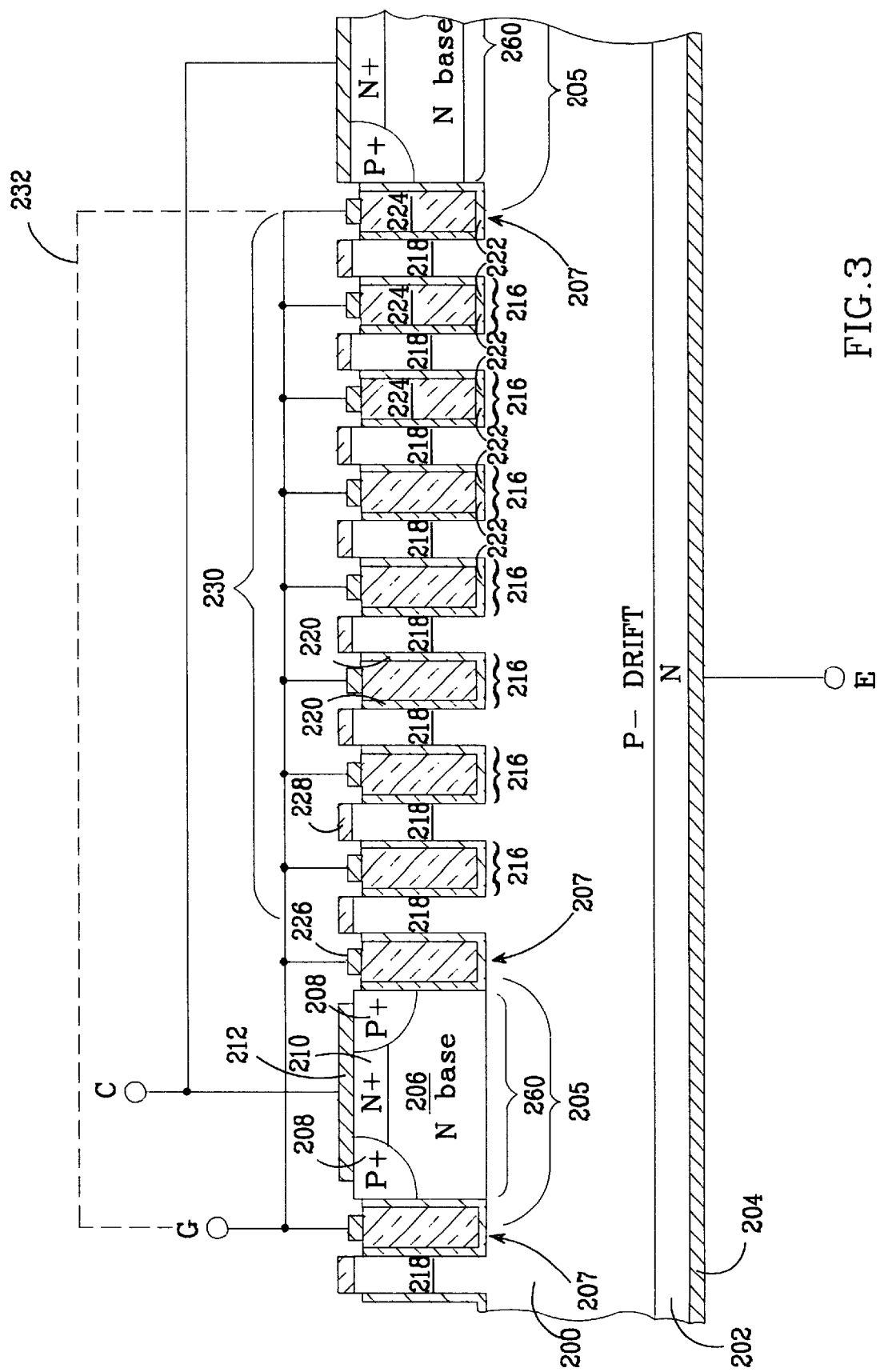
FIG. 3 is a sectional view of an opposite-polarity version of the device of FIG. 1.

An "opposite polarity" embodiment of an insulated-gate bipolar switch in accordance with the present invention is shown in FIG. 3. A foundation for the device is formed from a P– drift layer 200 on an N layer 202. An electrode 204 contacts the N layer 202 and serves as the device's emitter terminal E. IGBT structures 205 are formed with the addition of an N base region 206 on P– drift layer 200 sandwiched between a pair of trench gates 207, with P+ regions 208 typically occupying the upper corners of the N base region. A shallow N+ region 210 on N base region 206 provides an ohmic contact to the N base. An electrode 212 contacts both the N+ ohmic contact and P+ regions of IGBTs 205 and serves as the device's collector terminal C.

A plurality of trench gate structures 216 are recessed into P– drift layer 200 between IGBTs 205, with each pair of gates separated by respective floating mesas 218. Each gate 216 includes an oxide layer formed into a trench which includes oxide sidewalls 220 and an oxide bottom 222; though shown with square corners, the corners of the trench gate bottoms are preferably rounded. Each trench is filled with a conductive material 224, and an electrode 226 contacts the conductive material of each trench to provide a gate terminal G. Conductive material 224 is preferably polysilicon that has been heavily doped with acceptors.

Each floating mesa 218 consists of material such as P– drift layer 200 sandwiched between respective pairs of trench gates 216, with an oxide layer 228 across the top surface of each floating mesa. Thus, a pattern of structures 230 comprising trench gates 216 alternating with floating mesas 218 is located between each pair of IGBT structures 205. An IGBT structure 205 and the pattern of structures 230 located between it and the next IGBT structure form a unit cell 232.

The device is switched on by applying a voltage which is negative with respect to the collector to gate terminal G, which causes P– type inversion channels to form across the N base regions between P+ regions 208 and P– drift layer 200. The negative gate voltage also causes accumulation channels to form adjacent to the gate sidewalls 220 and bottoms 222 that contact P– drift layer 200. The inversion channels allow holes to flow from P+ regions 208 to P– drift layer 200, providing base drive for IGBT structures 205. In response, electrons are injected from the emitter into P– drift layer 200. The accumulation channels have a high channel mobility, which serves to enhance hole injection efficiency and reduce channel resistance.

The portions of IGBT structures 205 which are sandwiched between gates 207 form conductive mesas 260. The invention requires that the widths of floating mesas 218 be different from the widths of conductive mesas 260, to enable the resulting switch to provide a desired combination of $V_{FD}$, SCSOA, and RBSOA characteristics.

Figure 4:
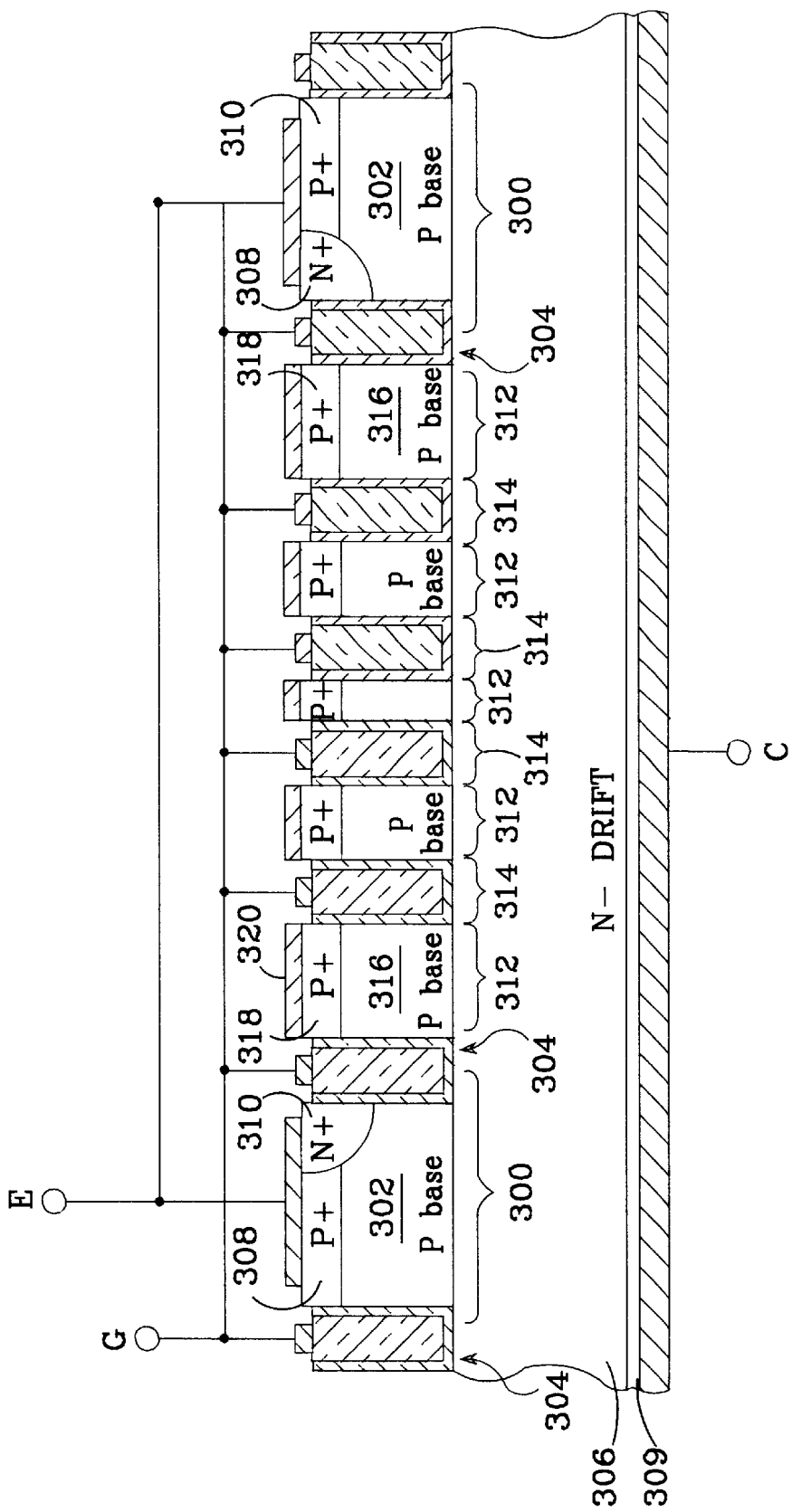
FIG. 4 is a sectional view illustrating several possible variations to the switch of FIG. 1.

Several possible variations to the present switch are illustrated in FIG. 4. As before, each IGBT structure 300 includes a P base region 302 sandwiched between a pair of trench gates 304 on an N– drift layer 306, with a P+ layer 308 providing an ohmic contact to the P base and a P layer 309 and a collector terminal C on the opposite side of N– drift layer 306. However, instead of having N+ regions in both corners of IGBT structure 300, there is only one N+ region 310. This results in only one inversion channel being formed across each of P base regions 302 when a positive gate voltage is applied; this results in a lower electron injection efficiency, but still provides a functional device.

A pattern of floating mesas 312 and trench gates 314 is still employed between IGBT structures 300, but here, the floating mesas includes P base and P+ layers 316 and 318, respectively, instead of the N– drift material shown in FIGS. 1 and 2. As each floating mesa is electrically isolated from the rest of the switch with a layer of oxide 320 across its top surface, the material making up the floating mesas has little to no effect on device performance.

Note also that the floating mesas need not have a uniform width; as shown in FIG. 4, floating mesas of varying widths may be used. The strength of the reverse-biased-induced electric field increases as one moves away from IGBT structures 300. Therefore, floating mesas 312 which become progressively narrower as their distance from the nearest IGBT structure increases (with the minimum mesa width limited by the fabrication process) make the electric field more uniform, thereby improving the switch's RBSOA and breakdown voltage characteristic.

The described switches can be fabricated on punch-through wafers (EPI), in which the drift layer (such as N– drift layer 100) comprises an epitaxial layer grown to a desired thickness and with a proper doping level on a bulk substrate material (P layer 102). The switches can also be fabricated on non-punch-through (NPT) wafers, in which the drift region (such as N– drift layer 306) is a bulk substrate material, and the P layer (such as P layer 309 in FIG. 4) is a thin layer of a material doped with boron which has been implanted or diffused from the backside. Several factors should be considered when determining which wafer-type to use. EPI wafers are more expensive than NPT wafers, but because the epitaxial layer has a controlled thickness and doping concentration, they offer a lower forward voltage drop. An NPT-based device will have a lower hole or electron injection efficiency (depending on device polarity) than an EPI-based device, and this property can be used to manipulate the stored charge and provide a better switching characteristic. In contrast, lifetime control is used to adjust the stored charge in an EPI-based device. The blocking voltage of the device is affected by the doping level and thickness of the drift layer; a doping level and thickness sufficient to provide a blocking voltage of at least 600 volts is preferred.

Figure 5:
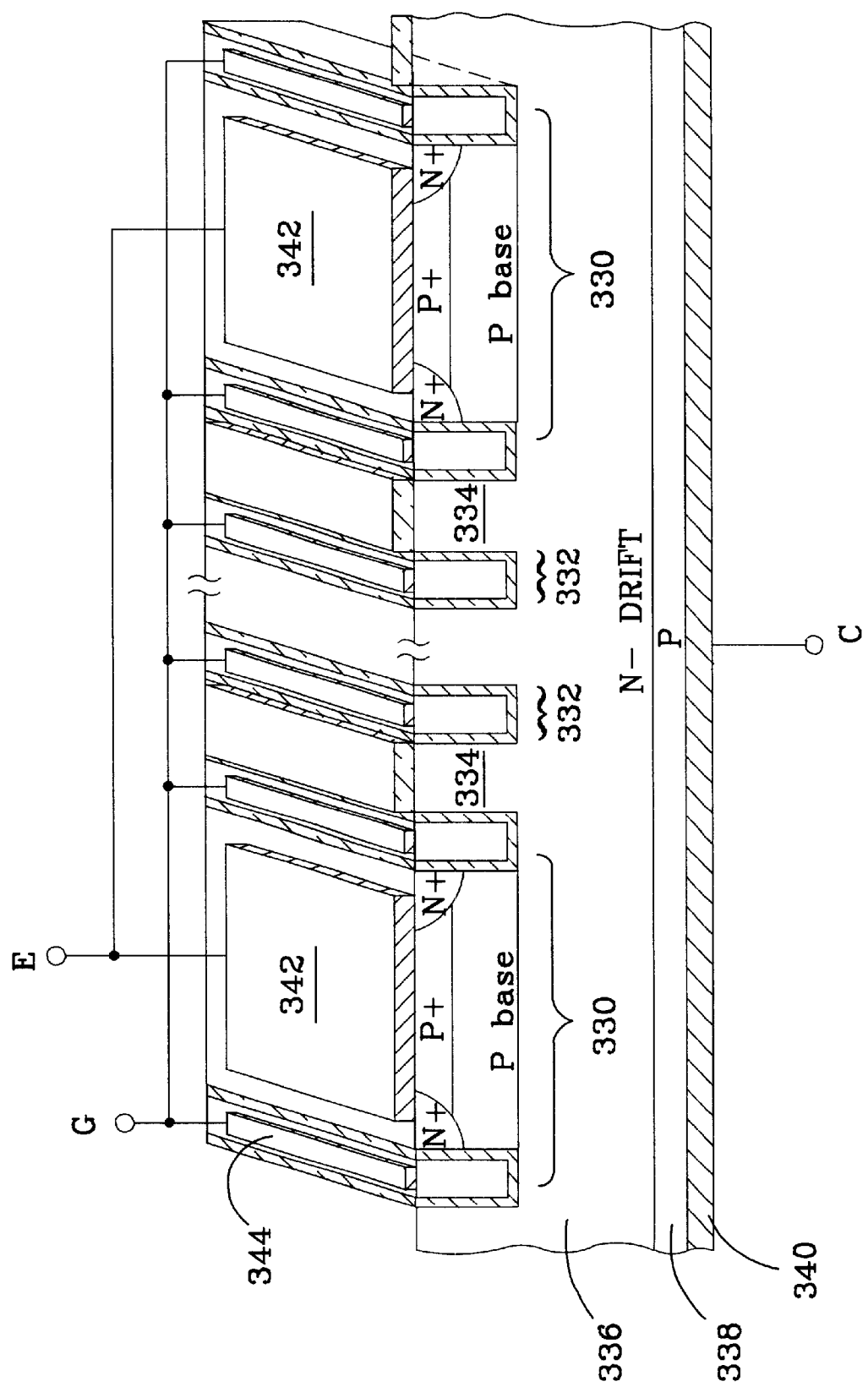
FIG. 5 is a perspective view of one embodiment of a multiple-cell implementation of an insulated-gate bipolar switch per the present invention.

As noted above, to create a practical device capable of carrying a high current, a number of unit cells as described above are fabricated on a die; one embodiment of such a multi-cell device is shown in FIG. 5. Here, trench-IGBT (330), trench gate (332) and floating mesa structures (334) are built on a foundation made from an N– drift layer 336 and a P layer 338 which run the length and width of the die. Each of structures 330, 332 and 334 is trench-shaped, runs the length of the die, and is spaced periodically across the width of the die. An electrode 340 on P layer 338 serves as the device's collector C, an electrode 342 contacts each of the IGBT structures to form the device's emitter E, and an electrode 344 contacts each of the gate structures to form the device's gate connection G. The number of floating mesas per unit cell, and the widths and depths of the gates, floating mesas, and IGBT structures can be selected as necessary to tailor the switch's performance for a particular application.

Figure 6:
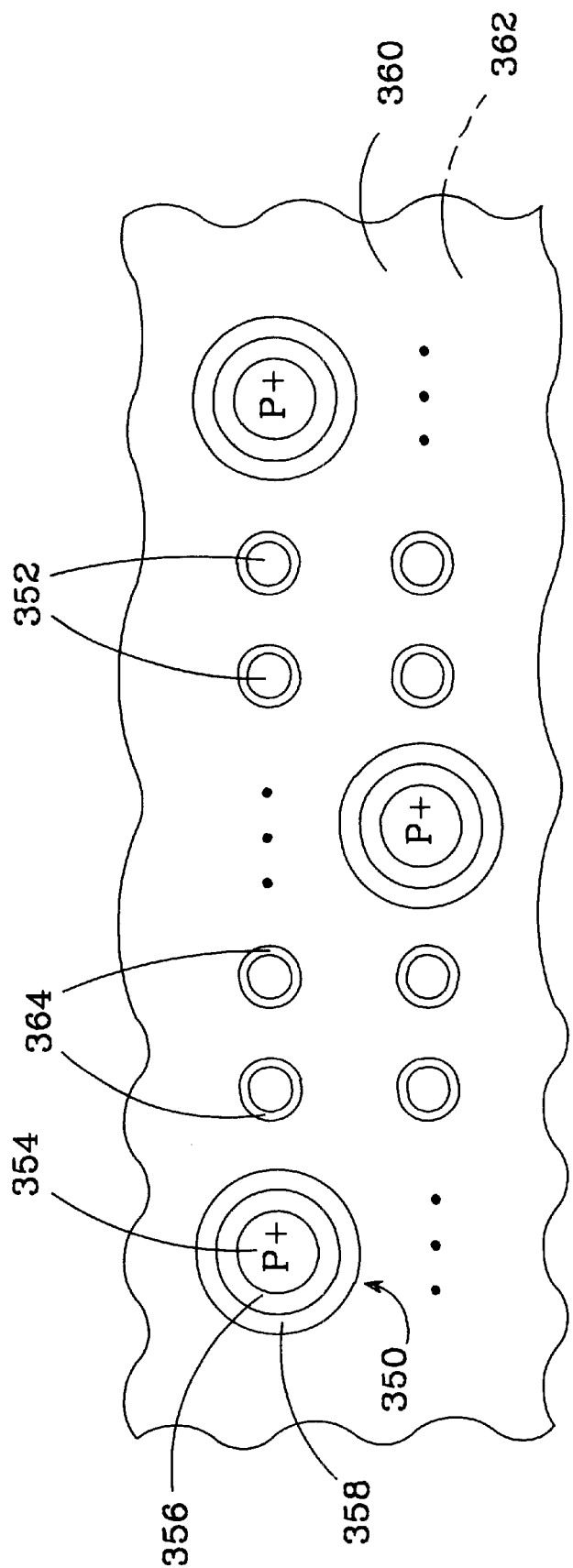
FIG. 6 is a plan view of one embodiment of a multiple-cell implementation of an insulated-gate bipolar switch per the present invention.

The shape of the interdigitated structures is not limited to that of the trench-shaped stripes shown in FIG. 5. One possible alternative embodiment is shown in the plan view of FIG. 6 (emitter, collector, and gate electrodes not shown for clarity). Here, cylindrical IGBT structures 350 are interdigitated with cylindrical floating mesas 352. Each IGBT structure is as described above, with a shallow P+ region 354 providing an ohmic contact to the P base region below it (not shown), surrounding by an N+ region 356 and the cylindrical oxide sidewalls 358 of a trench gate, built on a foundation made from an N− drift layer 360 on a P layer 362. Each floating mesa 352 is also surrounded with a trench gate's cylindrical oxide sidewall 364. The trench gate structures are formed by surrounding each cylindrical IGBT and floating mesa with oxide sidewalls, and having horizontal oxide bottoms (not shown) traverse the areas between oxide walls.

The configurations shown in FIGS. 1–6 are merely exemplary; many other structure shapes, (including, for example, squares, hexagons, and rectangles), sizes, and ratios could be used to provide a functional device. The trench-shaped stripe structures of FIG. 5 are preferred, as they provide good performance while being easily fabricated.

The performance of the switch is affected by the widths of the trench gates and floating mesas. A trench width of about 1–3 $\mu$m and a floating mesa width of about 1–2 $\mu$m are preferred, as they provides good performance while being practical to fabricate.

While particular embodiments of the invention have been shown and described, numerous variations and alternate embodiments will occur to those skilled in the art. Accordingly, it is intended that the invention be limited only in terms of the appended claims.

I claim:

1. An insulated-gate bipolar switch, comprising:
    a P layer;
    a first electrode which contacts said P layer and provides a collector connection for said switch;
    an N− drift layer on said P layer opposite said collector;
    a plurality of gates recessed into said N− drift layer, each of said gates arranged in a trench configuration and comprising:
        a layer of oxide forming the sidewalls and bottom of said trench, and
        a conductive material within said trench which connects a voltage applied to the top of said trench to said layer of oxide;
    a second electrode which contacts the conductive material in each of said trenches to provide a gate connection for said switch;
    a plurality of floating mesas sandwiched between respective pairs of said trench gates, each of said floating mesas having a layer of oxide across its top surface;
    at least one IGBT structure, each of said at least one IGBT structures comprising:
        a P base region on said N− drift layer,
        a P+ region on said P base region which provides an ohmic contact to said P base region, and
        an N+ region which contacts a portion of said P base region, said P base, P+ and N+ regions sandwiched between a pair of said trench gates and forming a conductive mesa, said P base and N+ regions arranged such that at least one of said trench gates adjacent said conductive mesa contacts said N+ and P base regions; and
    a third electrode which contacts the P+ ohmic contact and N+ regions of each of said at least one IGBT structures and provides an emitter connection for said switch;
    each of said conductive mesas having a width defined by the distance between the trench gates adjacent said conductive mesa, the widths of each of said floating mesas being different from the widths of said conductive mesas;
    said switch structure arranged such that the application of a voltage to said gate connection which is positive with respect to said emitter connection forms inversion channels across said P base regions and accumulation channels in said N− drift layer adjacent to said trench gate bottoms, said inversion channels providing conductive paths between said N+ regions and said N− drift layer that enable electrons to be injected from said N+ regions into said N− drift layer and said switch to be turned on when the voltage across said collector and emitter is sufficiently high and thereby allowing current to flow between said collector and said emitter connections via said IGBT structure, a zero or negative gate voltage eliminating said inversion channels and terminating conduction through the switch.

2. The insulated-gate bipolar switch of claim 1, wherein the widths of each of said floating mesas is about 1–2 $\mu$m.

3. The insulated-gate bipolar switch of claim 1, wherein said bipolar switch comprises a plurality of said IGBT structures, each pair of said IGBT structures separated by a pattern of structures which comprises ones of said trench gates alternating with ones of said floating mesas.

4. The insulated-gate bipolar switch of claim 3, wherein said pattern comprises 8–10 of said floating mesas.

5. The insulated-gate bipolar switch of claim 3, wherein the widths of each of said conductive mesas is less than the width of said pattern of structures.

6. The insulated-gate bipolar switch of claim 3, wherein each of said conductive mesas is about 24 $\mu$m, each of said trench gates is about 1–3 $\mu$m wide, and each of said floating mesas is about 1–2 $\mu$m wide.

7. The insulated-gate bipolar switch of claim 1, wherein each of said P base regions has a uniform depth and the depth of each of said trench gates is about equal to said P base regions' uniform depth.

8. The insulated-gate bipolar switch of claim 7, wherein the bottoms of said trench gates are within 0.2 $\mu$m of said P base regions' uniform depth and said P base regions are confined to their respective conductive mesas.

9. The insulated-gate bipolar switch of claim 1, wherein said floating mesas have respective uniform widths and said conductive mesas have respective uniform widths, said conductive mesas' uniform width being greater than said floating mesas' uniform width.

10. The insulated-gate bipolar switch of claim 1, wherein said floating mesas have varying widths which become progressively narrower as their distance from the nearest IGBT structure increases.

11. The insulated-gate bipolar switch of claim 1, wherein said conductive material is polysilicon which has been heavily doped with donors.

12. The insulated-gate bipolar switch of claim 1, wherein said N− drift layer is a bulk substrate material and said P layer is implanted or diffused into the backside of said N− drift layer.

13. The insulated-gate bipolar switch of claim 1, wherein said P layer is a bulk substrate material and said N− drift layer is an epitaxial layer grown on said P layer.

14. The insulated-gate bipolar switch of claim 1, wherein the corners of said trench gates' bottoms are rounded to reduce their susceptibility to breakdown when subjected to a reverse-bias-induced electric field.

15. An insulated-gate bipolar switch, comprising:
an N layer;
a first electrode which contacts said N layer and provides an emitter connection for said switch;
a P− drift layer on said N layer opposite said emitter;
a plurality of gates recessed into said P− drift layer, each of said gates arranged in a trench configuration and comprising:
a layer of oxide forming the sidewalls and bottom of said trench, and
a conductive material within said trench which connects a voltage applied to the top of said trench to said layer of oxide;
a second electrode which contacts the conductive material in each of said trenches to provide a gate connection for said switch;
a plurality of floating mesas sandwiched between respective pairs of said trench gates, each of said floating mesas having a layer of oxide across its top surface;
at least one IGBT structure, each of said at least one IGBT structures comprising:
an N base region on said P− drift layer,
an N+ region on said N base region which provides an ohmic contact to said N base region, and
a P+ region which contacts a portion of said N base region, said N base, N+ and P+ regions sandwiched between a pair of said trench gates and forming a conductive mesa, said N base and P+ regions arranged such that at least one of said trench gates adjacent said conductive mesa contacts said P+ and N base regions; and
a third electrode which contacts the N+ ohmic contact and P+ regions of each of said at least one IGBT structures and provides a collector connection for said switch;
each of said conductive mesas having a width defined by the distance between the trench gates adjacent said conductive mesa, the widths of each of said floating mesas being different from the widths of said conductive mesas;
said switch structure arranged such that the application of a voltage to said gate connection which is negative with respect to said collector connection forms inversion channels across said N base regions and accumulation channels in said P− drift layer adjacent to said trench gate bottoms, said inversion channels providing conductive paths between said P+ regions and said P− drift layer that enable holes to be injected from said P+ regions into said P− drift layer and said switch to be turned on when the voltage across said collector and emitter is sufficiently high and thereby allowing current to flow between said collector and said emitter connections via said IGBT structure, a zero or positive gate voltage eliminating said inversion channels and terminating conduction through the switch.

16. The insulated-gate bipolar switch of claim 15, wherein said switch comprises a plurality of said IGBT structures, each pair of said IGBT structures separated by a pattern of structures which comprises ones of said trench gates alternating with ones of said floating mesas.

17. The insulated-gate bipolar switch of claim 16, wherein the widths of each of said conductive mesas is less than the width of said pattern of structures.

18. The insulated-gate bipolar switch of claim 15, wherein said floating mesas have respective uniform widths and said conductive mesas have respective uniform widths, said conductive mesas' uniform width being greater than said floating mesas' uniform width.

19. The insulated-gate bipolar switch of claim 15, wherein said conductive material is polysilicon which has been heavily doped with acceptors.

20. The insulated-gate bipolar switch of claim 15, wherein the corners of said trench gates' bottoms are rounded.

21. The insulated-gate bipolar switch of claim 15, wherein said floating mesas have varying widths which become progressively narrower as their distance from the nearest IGBT structure increases.

22. An insulated-gate bipolar switch, comprising:
a P layer;
a first electrode which contacts said P layer and provides a collector connection for said switch;
an N− drift layer on said P layer opposite said collector;
a plurality of gates recessed into said N− drift layer, each of said gates arranged in a trench configuration and comprising:
a layer of oxide forming the sidewalls and bottom of said trench, and
a conductive material within said trench which connects a voltage applied to the top of said trench to said layer of oxide;
a second electrode which contacts the conductive material in each of said trenches to provide a gate connection for said switch;
a plurality of floating mesas sandwiched between respective pairs of said trench gates, each of said floating mesas having a layer of oxide across its top surface;
a plurality of IGBT structures, each of said IGBT structures comprising:
a P base region on said N− drift layer,
a P+ region on said P base region which provides an ohmic contact to said P base region, and
an N+ region which contacts a portion of said P base region, said P base, P+ and N+ regions sandwiched between a pair of said trench gates and forming a conductive mesa, said P base and N+ regions arranged such that at least one of said trench gates adjacent said conductive mesa contacts said N+ and P base regions;
each pair of said IGBT structures separated by a pattern of structures which comprises ones of said floating mesas alternating with ones of said trench gates; and
a third electrode which contacts the P+ ohmic contact and the N+ regions of each of said IGBT structures and provides an emitter connection for said switch;
each of said conductive mesas having a uniform width defined by the distance between the trench gates adjacent said conductive mesa, the widths of each of said floating mesas being different from said conductive mesas' uniform width;
said switch structure arranged such that the application of a voltage to said gate connection which is positive with respect to said emitter connection forms inversion channels across said P base regions and accumulation channels in said N− drift layer adjacent to said trench gate bottoms, said inversion channels providing conductive paths between said N+ regions and said N− drift layer that enable electrons to be injected from said N+ regions into said N− drift layer and said switch to be turned on when the voltage across said collector and emitter is sufficiently high and thereby allowing current to flow between said collector and said emitter connections via said IGBT structures, a zero or negative gate voltage eliminating said inversion channels and terminating conduction through the switch.

23. The insulated-gate bipolar switch of claim 22, wherein said floating mesas have a uniform width and said conductive mesas' uniform width is wider than said floating mesas' uniform width.

24. The insulated-gate bipolar switch of claim 22, wherein said floating mesas have varying widths.

25. The insulated-gate bipolar switch of claim 22, wherein said pattern comprises 8–10 of said floating mesas.

26. The insulated-gate bipolar switch of claim 22, wherein each of said conductive mesas is about 24 $\mu$m wide, each of said trench gates is about 1–3 $\mu$m wide, and each of said floating mesas is about 1–2 $\mu$m wide.

27. The insulated-gate bipolar switch of claim 22, wherein said switch resides on a die in which said P layer and said N− drift layer run the length and width of said die.

28. The insulated-gate bipolar switch of claim 27, wherein said IGBT structures and said gates are trench-shaped, run the length of said die, and are spaced periodically across the width of said die.

29. The insulated-gate bipolar switch of claim 27, wherein said IGBT structures and said floating mesas are cylindrical and are spaced periodically across the length and width of said die.

* * * * *

UNITED STATES PATENT AND TRADEMARK OFFICE
CERTIFICATE OF CORRECTION

| | | |
|---|---|---|
| PATENT NO. | : 6,399,998 B1 | Page 1 of 1 |
| APPLICATION NO. | : 09/675401 | |
| DATED | : June 4, 2002 | |
| INVENTOR(S) | : Hsueh-Rong Chang | |

It is certified that error appears in the above-identified patent and that said Letters Patent is hereby corrected as shown below:

In column 1, line 4 (following the title and preceding the heading "Background of the Invention"), the following government rights statement should be inserted:

-- This invention was made with Government support under Contract N00014-99-3-0006 awarded by the U.S. Navy, Office of Naval Research. The Government has certain rights in this invention. --

Signed and Sealed this

Thirtieth Day of December, 2008

JON W. DUDAS
*Director of the United States Patent and Trademark Office*